United States Patent [19]

Morigami

[11] Patent Number: 5,400,281
[45] Date of Patent: Mar. 21, 1995

[54] STATIC RANDOM ACCESS MEMORY DEVICE WITH MEMORY CELL TESTING CIRCUIT

[75] Inventor: Seiichi Morigami, Tokyo, Japan

[73] Assignee: NEC Corporation, Japan

[21] Appl. No.: 905,917

[22] Filed: Jun. 29, 1992

[30] Foreign Application Priority Data

Jun. 27, 1991 [JP] Japan ................................ 3-183103

[51] Int. Cl.$^6$ .............................................. G11C 7/00
[52] U.S. Cl. ................. 365/201; 365/189.07; 371/21.1
[58] Field of Search ................. 365/201, 200, 189.05; 371/21.1, 21.2, 21.3, 189.07

[56] References Cited

U.S. PATENT DOCUMENTS 4,860,295  8/1989  Tobita .................................. 371/21.2
4,873,669 10/1989  Furutani et al. ...................... 361/201

FOREIGN PATENT DOCUMENTS 0193210  9/1986  European Pat. Off. .
292300  12/1986  Japan .................................... 371/21

Primary Examiner—Do Hyun Yoo
Assistant Examiner—Vu Le
Attorney, Agent, or Firm—Laff, Whitesel, Conte & Saret, Ltd.

[57] ABSTRACT

A static random access memory device in which a time required for testing memory cells Is shortened. The static random access memory device includes a test mode setting circuit for activating, in a test mode, a plurality of write circuits and a plurality of sense amplifiers. The device also includes a test mode switching circuit. An input data from an input circuit is written in the plurality of memory cells simultaneously through the write circuits. A plurality of data read out from the memory cells simultaneously are transferred to the test mode switching circuit which decides coincidence among the read data. On the basis of the decision result, an output circuit outputs at a data output terminal output signals in three states, that is, in a logic "1", a logic "0" or a high impedance. Since the plurality of memory cells are checked simultaneously, the required time for testing the memory cells can be shortened.

2 Claims, 6 Drawing Sheets

STATIC RANDOM ACCESS MEMORY DEVICE WITH MEMORY CELL TESTING CIRCUIT

BACKGROUND OF THE INVENTION

1. Field of the Invention

The present invention relates to a static-type random access memory device (hereinafter referred to as "SRAM") and, more particularly, to a test mode switching circuit for a data read-out time.

2. Description of the Related Art

One of previously known SRAMs with one bit output is shown in FIG. 4. As shown in FIG. 4, a memory cell array part 41 is divided into a plurality of memory cell blocks which are memory cell arrays 41a to 41n each being further divided into four memory sections S1 to S4. A sense amplifier 42 is provided for each of the memory sections S1 to S4, and a write buffer 43 is provided also for each of the memory sections S1 to S4.

An input circuit represented by numeral 44 includes, as shown in FIG. 6, a NOR circuit 61 and a plurality of inverter circuits (hereinafter simply referred to as "Inverters") I61 to I617.

An output circuit is represented by numeral 45. As shown in FIG. 5, the output circuit 45 includes a plurality of transfer gates TR61 to TR64, an inverter I56, and an output buffer unit BF50. The transfer gate TR61 includes an NMOS transistor (hereinafter referred to as "NMOST") Q51, a PMOS transistor (hereinafter referred to as "PMOST") Q52 and an inverter I51; the transfer gate TR62 includes an NMOST Q53, a PMOST Q54 and an inverter I52; the transfer gate TR63 includes an NMOST Q55, a PMOST Q56 and an inverter I53; and the transfer gate TR64 includes an NMOST Q57, a PMOST Q58 and an inverter I54, respectively. The transfer gates TR61 to TR64 are connected with the output buffer unit BF50 through the inverter I56. The buffer unit BF50 is composed of inverters I57 to I59, a NOR gate 51, a NAND gate 52, a PMOST Q59 and an NMOST Q510.

Referring back to FIG. 4, signal lines RB1 to RB4 are read-out data bus lines connected with outputs of the sense amplifiers 42 belonging to the corresponding memory sections S1 to S4, respectively, and also with inputs of the output circuit 45. Signal lines WB1 to WB4 and WBB1 to WBB4 are write data bus lines (output signal lines of the input circuit 44) connected with the inputs of the write buffers 43 belonging to the corresponding memory sections S1 to S4, respectively.

An explanation will be given of the actual operation of the conventional SRAM device explained above. The write operation is as follows. An external signal $D_{IN}$ is buffered by the input circuit 44. The input buffer 44 transfers write data to the write data bus lines WB1 to WB4 and WBB1 to WBB4. One write buffer 43 corresponding to a selected address is selected from a group of the write buffers 43. The selected write buffer 43 operates to write or store the data in a selected memory cell.

The read operation is as follows. One sense amplifier 42 corresponding to a selected memory cell is selected from a group of the sense amplifiers 42. The sense amplifier 42 thus selected amplifies the data read out from the selected memory cell. For example, if a memory cell within the memory section S1 of memory cell array 41a is selected, the data is transferred to the output circuit 45 through the read data bus line RB1. Then, among transfer gate control signals $\phi1$ to $\phi4$ for the output circuit 45, the control signal $\phi1$ is set at "L" (low level) whereas the remaining control signals $\phi2$ to $\phi4$ are set at "H" (high level). Therefore, the transfer gate TR61 formed by the NMOST Q51, PMOST Q52 and the inverter I51 becomes "on", whereas the transfer gate TR62 (formed by the NMOST Q53, PMOST Q54 and the inverter I52), the transfer gate TR63 (formed by the NMOST Q55, PMOST Q56 and the inverter I53), and the transfer gate TR64 (formed by the NMOST Q57, PMOST Q58 and the inverter I54) become "off", respectively. As a result, only the data on the read data bus line RB1 is transferred to a node N51. The level at this node NS1 is first inverted by the inverter I56 and then buffered by the output buffer unit BF50, so that a read data is outputted from a signal output terminal $D_{OUT}$.

The above explained conventional SRAM device has the following defect. Since the conventional SRAM device reads or writes data one bit by one bit, it takes a long test time in a memory test system and takes longer time as the memory capacity increases to such as 1 mega, 4 mega and 16 mega bits.

For example, even only for reading the memory cells of 4M bits capacity successively with a clock cycle time of 1 $\mu$sec, it takes $1 \times 10^{-6} \times 4 \times 10^6$ (sec). In practice, since memory tests of such kinds as above and other kinds are performed many times under different conditions or parameters such as different voltages, the total test time required may reach several hundred seconds, thereby significantly increasing the cost involved for such tests. The defect in the conventional SRAM device is to be solved by the present invention.

SUMMARY OF THE INVENTION

It is, therefore, an object of the invention to overcome the problems existing in the conventional static RAM device and to provide an improved static RAM device in which a time required to a memory testing is shortened.

According to one aspect of the present invention, there is provided a static random access memory device comprising:

a plurality of memory cell blocks each of which has a plurality of memory cell sections;

a plurality of write circuits which write data in the plurality of memory cell blocks, respectively;

a plurality of sense amplifiers which amplify the data read out from the memory cell blocks, respectively;

an input circuit which, in a normal mode, supplies an input data to a selected memory cell section among the plurality of memory cell sections through one of the plurality of write circuits corresponding to the selected memory cell section;

an output circuit which, in the normal mode, outputs a read out data read out from a selected memory cell section among the plurality of memory cell sections by one of the plurality of sense amplifiers corresponding to the selected memory cell;

a test mode setting circuit which, in a test mode, activates the plurality of write circuits for performing the data writing in the plurality of memory cell sections simultaneously, and activates the plurality of sense amplifiers for performing the data reading from the plurality of memory cell sections simultaneously; and a test mode switching circuit which, in the test mode, logically processes the data supplied from the plurality of sense amplifiers activated by the test mode setting circuit and causes the output circuit to display information as to presence or absence of any defective memory cells.

In a test mode, the test mode setting circuit operates to activate a plurality of write circuits and also a plurality of sense amplifiers. Under this state, the input data supplied from the input circuit are written in a plurality of memory cell sections simultaneously and a plurality of data read out from the memory cell sections are logically processed by the test mode switching circuit, so that the output circuit indicates the presence or absence of a defect bit(s) existing in the memory cells.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, some preferred embodiments of the invention will be explained with reference to the accompanying drawings.

Figure 1:
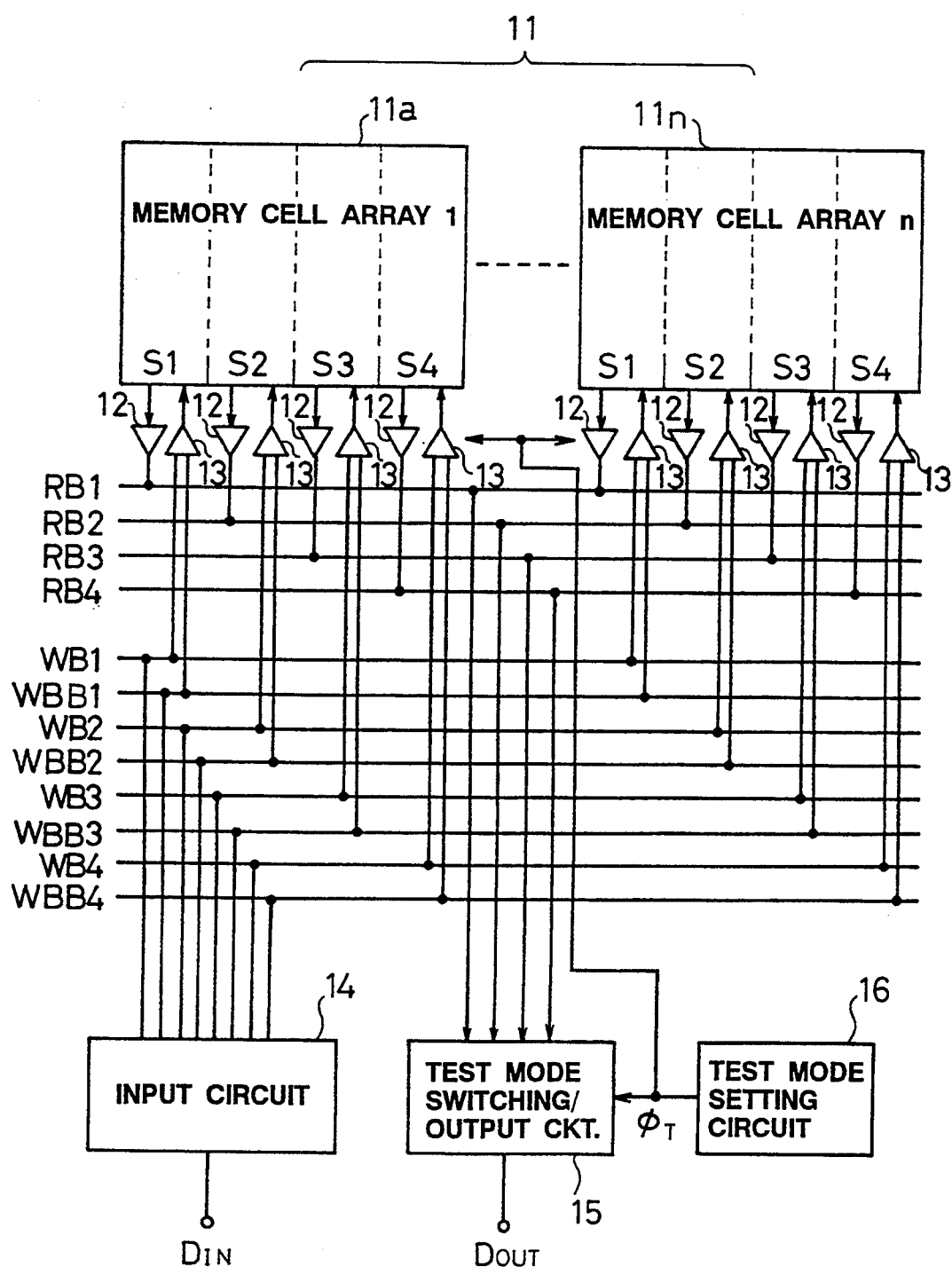
FIG. 1 is a block diagram showing a static RAM of a first embodiment according to the present invention.
Figure 4:
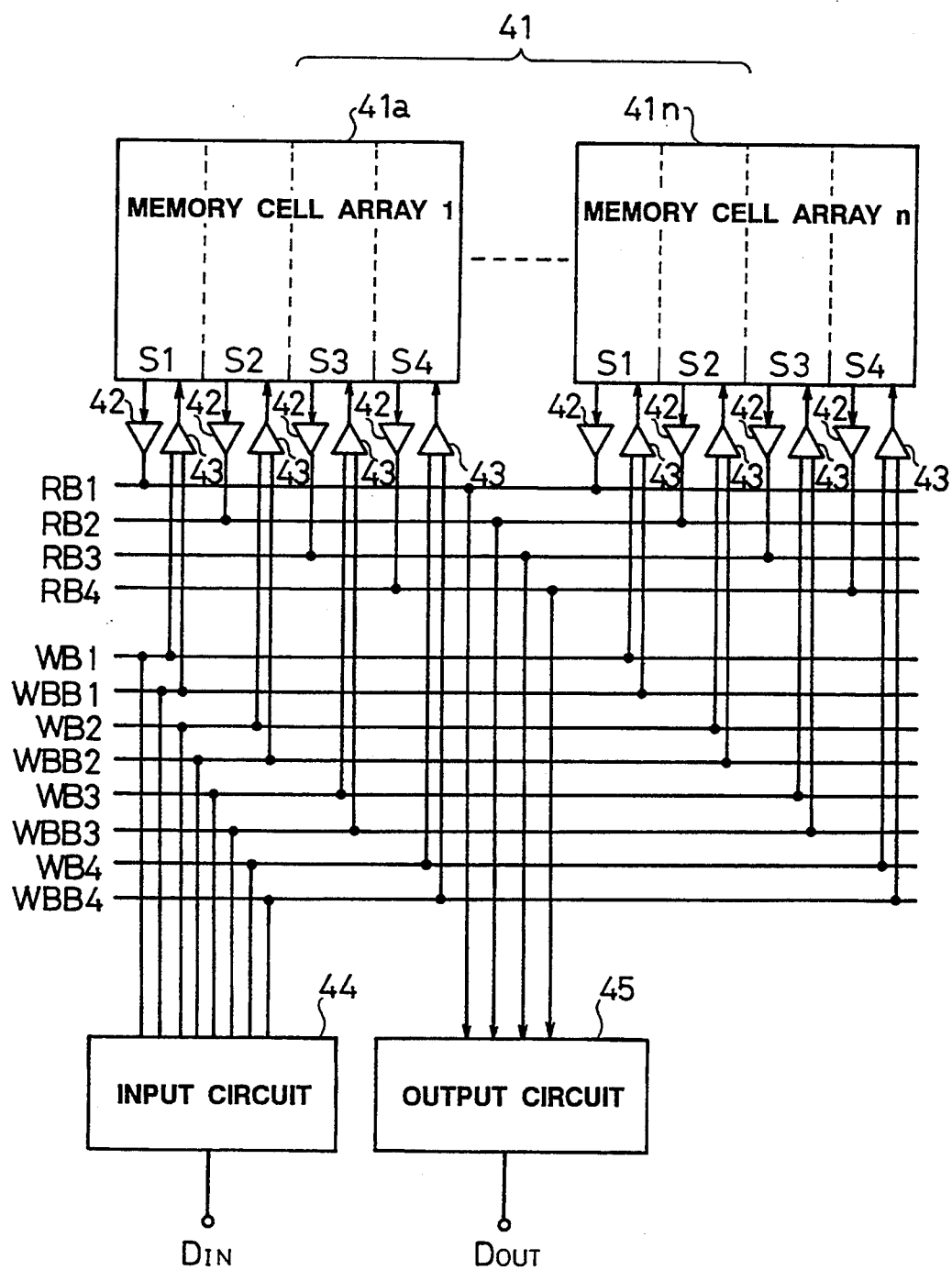
FIG. 4 is a block diagram showing a conventional static RAM.
Figure 5:
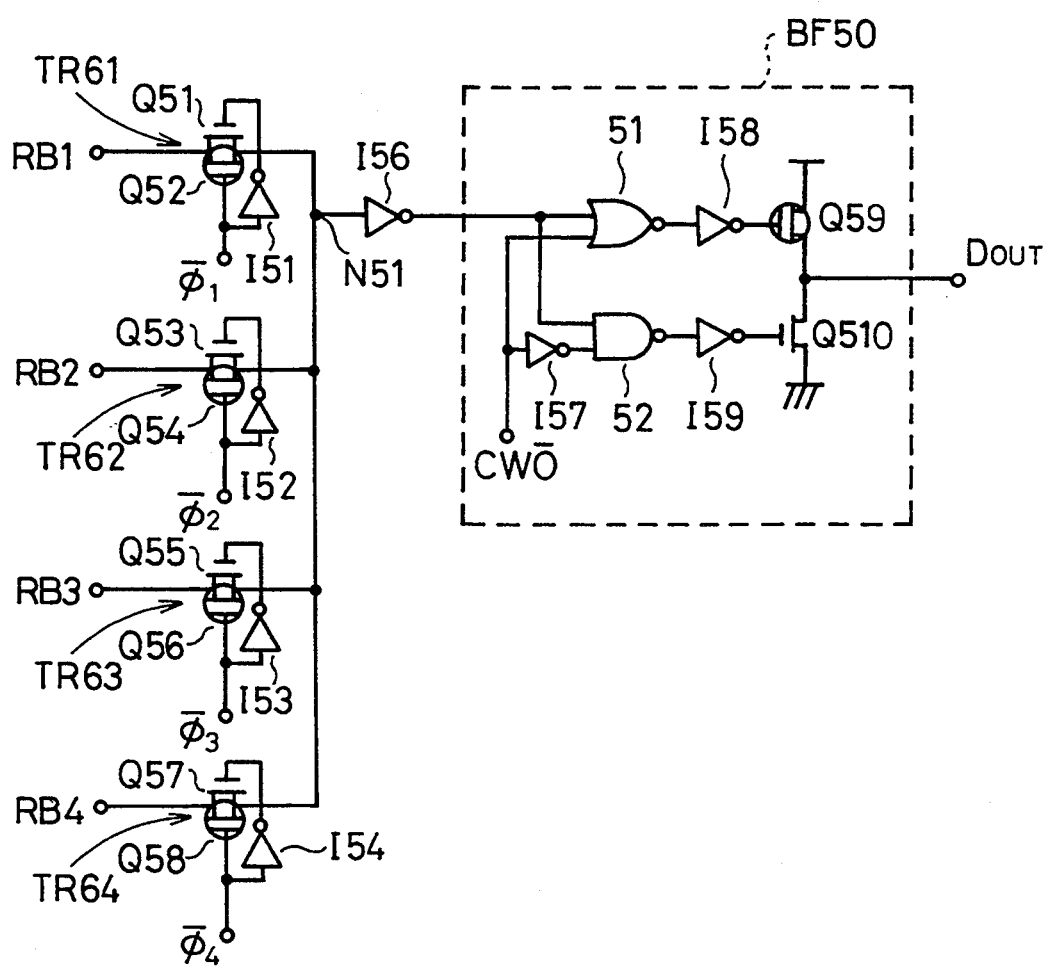
FIG. 5 is a detailed circuit diagram of an output circuit in the conventional SRAM.

FIG. 1 shows an arrangement of a static RAM device (SRAM) according to the present invention. As shown in FIG. 1, a memory cell array part 11 is, as in the conventional arrangement, divided into a plurality of memory cell arrays 11a to 11n each being further divided into four memory sections S1 to S4. A sense amplifier 12 is provided for each of the memory sections S1 to S4, and a write buffer 13 is provided also for each of the memory sections S1 to S4. The circuits provided include a test mode switching/output circuit 15, a test mode setting circuit 16, and an input circuit 14 which is substantially the same as the input circuit 44 of the conventional SRAM already explained with reference to FIG. 4. Read data bus lines RB1 to RB4 are connected with inputs of the test mode switching/output circuit 15. Write data bus lines WB1 to WB4 and WBB1 to WBB4 are connected with inputs of the write buffers 13, respectively. A test mode enable signal $\phi T$ is supplied to the sense amplifiers 12, the write buffers 13 and the test mode switching/output circuit 15.

Figure 2:
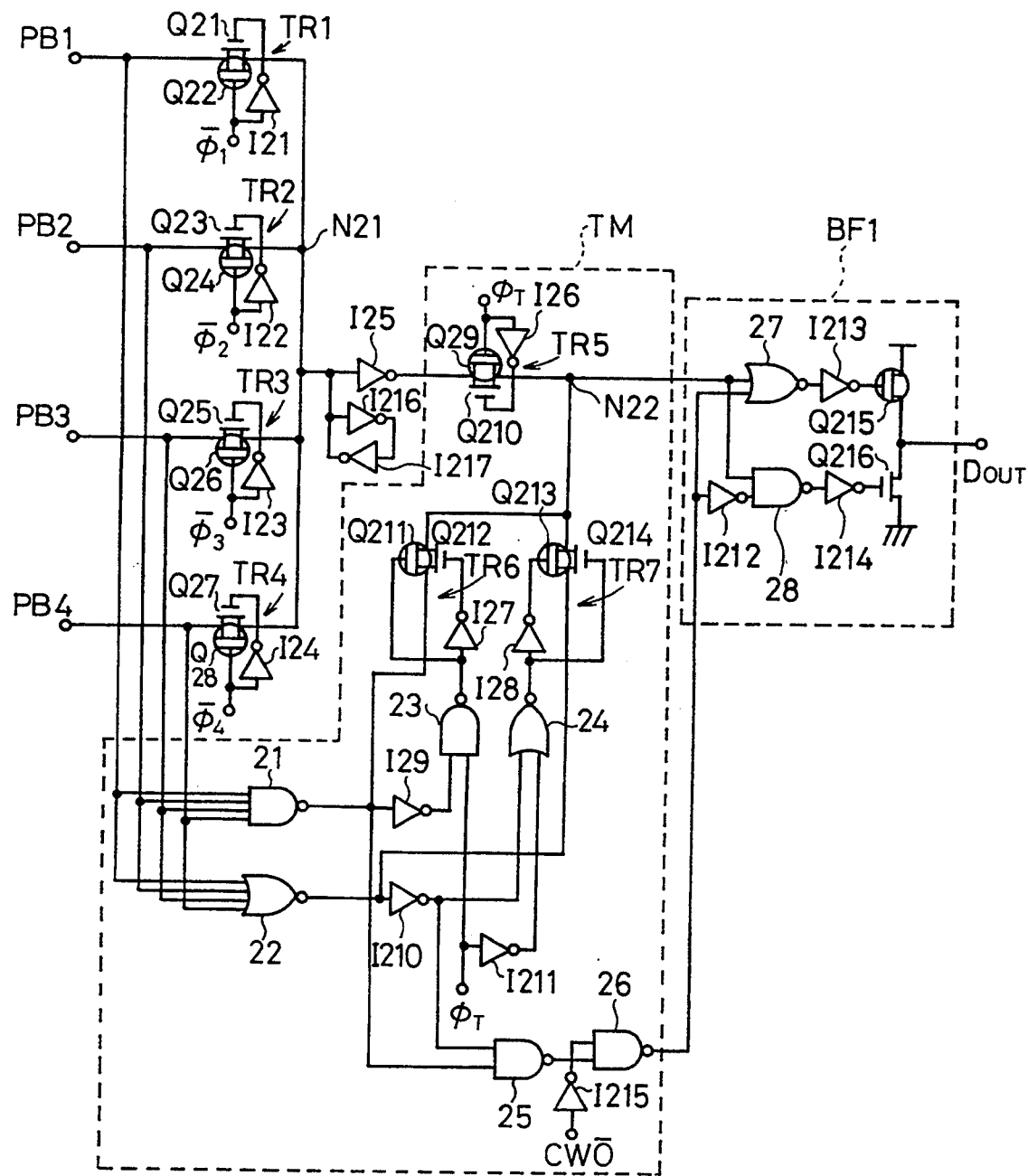
FIG. 2 is a detailed circuit diagram showing a test-mode switching/output circuit in the gRAM in FIG. 1, of a first embodiment.

FIG. 2 shows the details of the test mode switching/output circuit 15. The circuit 15 is composed of transfer gates TR1 to TR4, inverters I25, I216 and I217, a test mode switching circuit TM and a buffer circuit BF1. Specifically, the transfer gate TR1 includes an NMOST Q21, a PMOST Q22 and an inverter I21; the transfer gate TR2 includes an NMOST Q23, a PMOST Q24 and an inverter I22; the transfer gate TR3 includes an NMOST Q25, a PMOST Q26 and an inverter I23; and the transfer gate TR4 includes an NMOST Q27, a PMOST Q28 and an inverter I24. The inverters I216 and I217 constitute a flip-flop circuit.

The test mode switching circuit TM is composed of transfer gates TR5, TR6 and TR7; inverters I29, I210, I211 and I215; NAND gates 21, 23, 25, and 26; and NOR gates 22 and 24. Specifically, the transfer gate TR5 includes a PMOST Q29, an NMOST Q210 and an inverter I26; the transfer gate TR6 includes a PMOST Q211, an NMOST Q212 and an inverter I27: and the transfer gate TR7 includes a PMOST Q213, an NMOST Q214 and an inverter I28.

The buffer circuit BF1 is composed of inverters I212, I213 and I214; a NOR gate 27, a NAND gate 28, a PMOST Q215 and an NMOST Q216.

In this embodiment, the transfer gate TR5 constitutes a first transfer gate which interrupts the data path from the transfer gate TR1 through TR4 to the output buffer unit BF1 in a test mode. The NAND gates 21, 23, 25, 26, the NOR gates 22, 24 and the inverters I29, I210, I211 and I215 constitute a coincidence circuit which logically processes the read out data from the sense amplifiers 12 in the test mode. The transfer gates TR6 and TR7 constitute a second transfer gate which transfers the resultant signal from the coincidence circuit to the output buffer unit BF1 in the test mode.

Next, the operation of the SRAM device according to this embodiment will be explained below.

First, the normal mode operation will be explained. In the normal mode, an output signal $\phi T$ (a test mode enable signal) from the test mode setting circuit 16 is set at "L" (low level).

Figure 6:
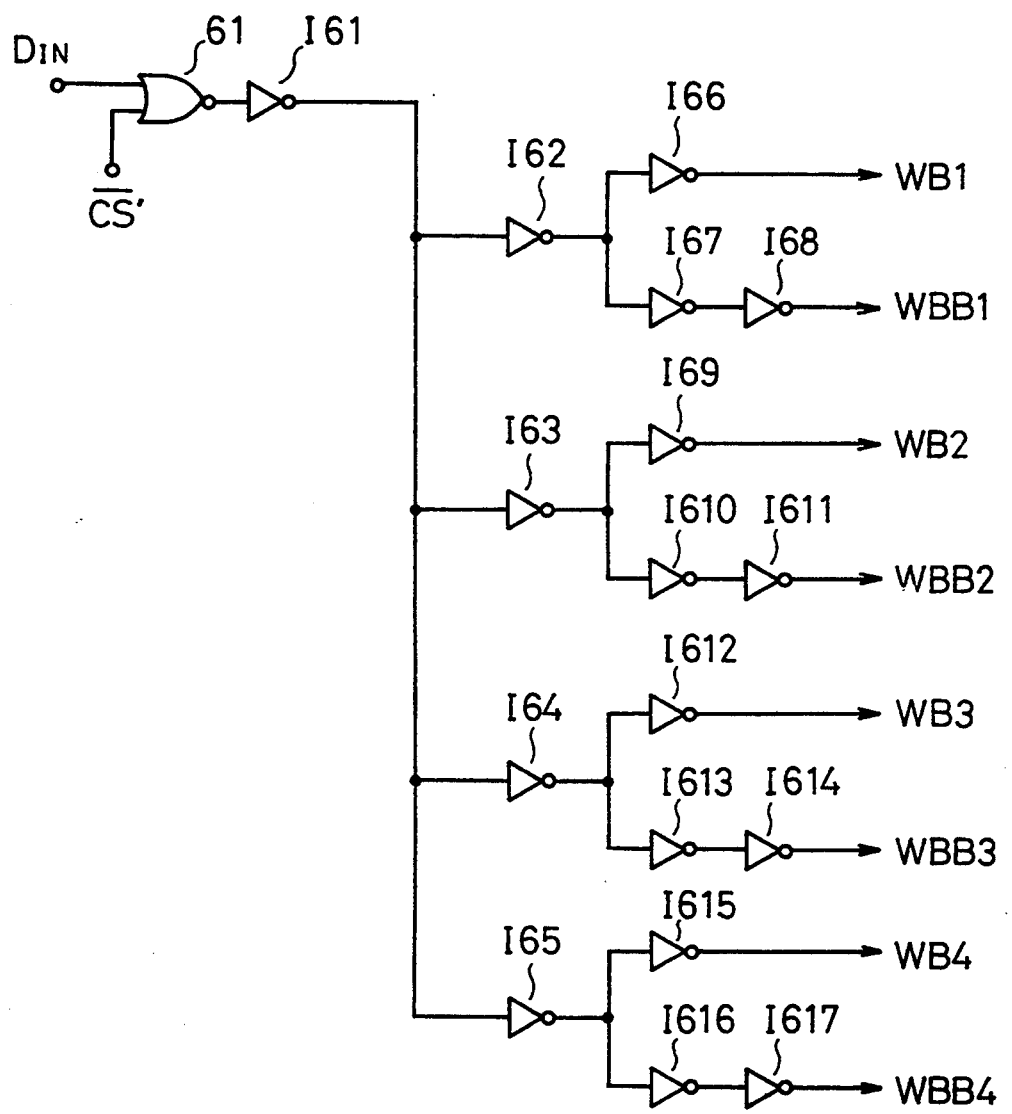
FIG. 6 is a detailed circuit diagram of an input circuit in the conventional SRAM.

The write operation in the normal mode is as follows. An external input signal $D_{IN}$ is buffered by the input circuit 14 (see FIG. 6). The input buffer 14 then transfers write data to write data bus lines WB1 to WB4 and WBB1 to WBB4. One write buffer 13 which corresponds to a selected address is selected from among a group of the write buffers 13. The selected write buffer 13 operates to write or store the data in a selected memory cell.

The read operation in the normal mode is as follows. One sense amplifier 12 which corresponds to a selected memory cell is selected from among a group of the sense amplifiers 12. The sense amplifier 12 amplifies the data read out from the selected memory cell. For example, in the case where a memory cell within the memory section S1 of the memory cell array 11a is selected, the data is transferred to the test mode switching/output circuit 15 (FIG. 2) through the read data bus line RB1. Then, among transfer gate control signals $\phi 1$ to $\phi 4$ for the test mode switching/output circuit 15, $\phi 1$ is set at "L" (low level) whereas $\phi 2$ to $\phi 4$ are set at "H" (high level). Therefore, only the transfer gate TR1 becomes "on", whereas the transfer gates TR2 to TR4 become "off". As a result, only the data on the read data bus line RB1 is transferred to a node N21.

Here, the transfer gate TR5 in the test mode switching circuit TM is "on" since the test mode enable signal $\phi T$ has been set at "L". On the other hand, the transfer gate TR6 is "off" since the output from the NAND gate 23 to which $\phi T$ of "L" is supplied is at "H", and the transfer gate TR7 is "off" since the output from the NOR gate 24 to which the signal with the $\phi T$ level inverted by the inverter I211 is supplied is at "L". Thus, to a node N22 a signal with the level at the node N21 being inverted by the inverter I25 is transferred. The signal at the node N22 is buffered by the output buffer unit BF1 and a read out data is outputted from the signal output terminal $D_{OUT}$ thereof.

Next, the test mode operation will be explained below. In this test mode, unlike the normal mode explained above, the test mode enable signal $\phi T$ is set at "H", so that, in both the write and read operations, all of the four write buffers 13 and the four sense amplifiers 12 corresponding to the respective four memory sections S1 to S4 of the memory cell array are selected simultaneously.

Now, the data write operation in the test mode is as follows. The external input signal $D_{IN}$ is buffered by the input circuit 14 (see FIG. 6). The input buffer 14 transfers the write data to the write data bus lines WB1 to WB4 and WBB1 to WBB4. Four write buffers 13 corresponding to the selected addresses are selected from among a group of the write buffers 13. The selected four write buffers 13 operate to write or store the same data in the selected memory cells of four bits simultaneously.

The read operation in the test mode is as follows. Four sense amplifiers 12 corresponding to the selected memory cells are selected from among a group of the sense amplifiers 12. The selected sense amplifiers 12 respectively amplify the data read from the corresponding memory cells. The data are then transferred to the test mode switching/output circuit 15 through the read data bus lines RB1 to RB4. In the test mode, the transfer gate control signals $\phi 1$ to $\phi 4$ for the test mode switching/output circuit 15 are set so as to act simultaneously, so that all of $\phi 1$ to $\phi 4$ are set at "H" (high level). In response thereto, all the transfer gates TR1 to TR4 are turned "off". In this case, the node N21 is prevented from being in a floating state by the flip-flop circuit formed by the two inverters I216 and I217 connected in a reversed direction with each other. The transfer gate TR5 is "off" because $\phi T$ in the test mode is set at "H".

First, an explanation is given on the case where all the data read out from the memory cells are at "L" (low level). Where all the read out data are at "L", all of the read data bus lines RB1 to RB4 are at "L". Thus, the output of the NAND gate 21 is at "H", the output of the inverter I29 is at "L" and the output of the NAND gate 23 is at "H". As a result, the transfer gate TR6 is "off". Further, since all the inputs to the NOR gate 22 are at "L", the output thereof is at "H", and hence the output of the inverter I210 is "L"; on the other hand, since $\phi T$ is now at "H", the output of the inverter I211 is at "L". Thus, the output of the NOR gate 24 is at "H". As a result, the transfer gate TR7 is "on". Accordingly, the signal with the output level ("H") of the NOR gate 22 is transferred to the node N22 through the transfer gate TR7, and the output buffer unit BF1 produces a low level signal at its signal output terminal $D_{OUT}$.

Next, an explanation is given on the case where all the data read out from the memory cells are at "H" (high level) contrary to the above case. Where the read out data are all at "H", all of the read data bus lines RB1 to RB4 are at "H". Thus, the output of the NOR gate 22 is at "L", and hence the output of the inverter I210 is at "H" and further the output of the NOR gate 24 is at "L". As a result, the transfer gate TR7 is "off". Further, since all the inputs to the NAND gate 21 are "H", the output of the NAND gate 21 is at "L" and hence the output of the inverter I29 is at "H" whereas the signal $\phi T$ is at "H". Thus, the output of the NAND gate 23 is at "L". As a result, the transfer gate TR6 is "on". Accordingly, the signal with the output level ("L") of the NAND gate 21 is transferred to the node N22, and the output buffer unit BF1 produces a high level signal at the signal output terminal $D_{OUT}$.

Thirdly, an explanation is given on the case where the data of, e.g., one bit memory cell among the four bit memory cells is an opposite level data (i.e., one bit among the four bit memory cells is defective). In this case, since the opposite level data is included in the read data bus lines RB1 to RB4, the output of the NAND gate 21 is at "H", and hence the output of the inverter I29 is at "L" and the output of the NAND gate 23 is at "H". As a result, the transfer gate TR6 is "off". Since the output of the NOR gate 22 is at "L", the output of the inverter I210 is at "H" and the output of the NOR gate 24 is at "L". Thus, the transfer gate TR7 is also "off". Further, since the output of the NAND gate 21 is at "H" and the output of the inverter I210 is at "H", the output of the NAND gate 25 is at "L" and so the output of the NAND gate 26 is at "H". Thus, in the output buffer unit BF1, the output of the NOR gate 27 is at "L", and the output of the inverter I213 is at "H". As a result, the PMOST Q215 is "off". Since the output of the inverter 212 is at "L", the output of the NAND gate 28 is at "H" and so the output of the inverter 1214 is "L". Thus, the NMOST Q216 is "off". Accordingly, the signal output terminal $D_{OUT}$ is placed in a high impedance state.

Additionally, where all the four bit memory cells are defective and the corresponding data are all fixed at either "H" or "L", the same operation as described above is carried out. In this case, however, since the data opposite to the stored data in level are outputted from the signal output terminal $D_{OUT}$, such defect can be easily detected and decided.

Figure 3:
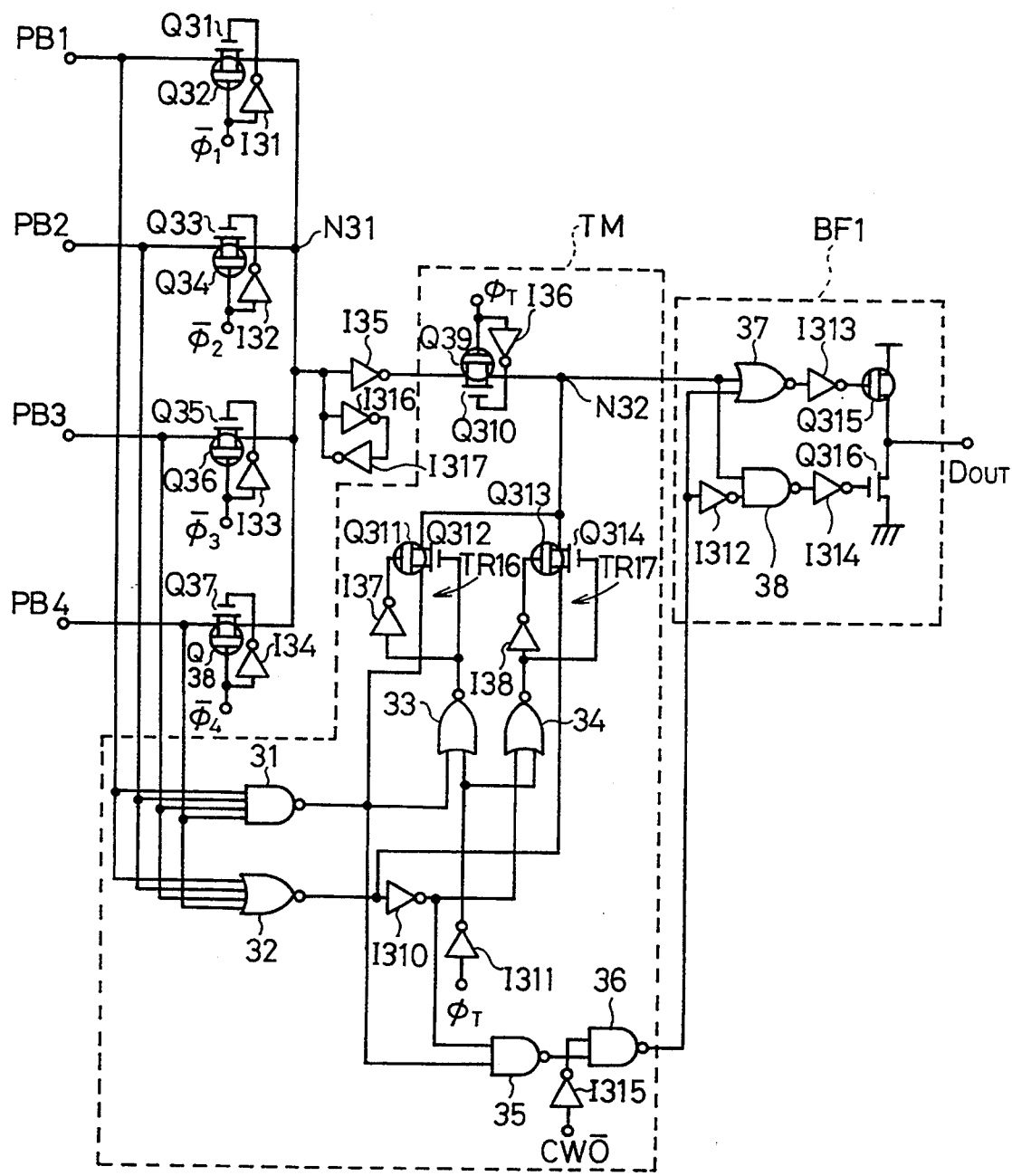
FIG. 3 is a detailed circuit diagram showing a test-mode switching/output circuit of another embodiment.

FIG. 3 shows an arrangement of the test mode switching/output circuit of the second embodiment according to the present invention. This arrangement is different from that in the above explained first embodiment in that in the test mode switching circuit TM, a transfer gate TR16 formed by a PMOST Q311, an NMOST Q312 and an inverter I37 is controlled by a NOR gate 33. As the operating principle is entirely the same as that of the first embodiment, an explanation is not repeated here.

As has been explained hereinabove, in the static RAM device according to the present invention, in the test mode, the same data is stored in the plurality of memory cells simultaneously and then the data read out from such memory cells are logically processed, so that an output signal indicative of the status of the memory cells is outputted from the signal output terminal. Thus, the time required to test a static RAM can be shortened.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A static random access memory device comprising:
  a plurality of read-out data bus lines;
  a plurality of writing data bus lines independent from said plurality of read-out data bus lines;
  a plurality of memory cell blocks each of which has plurality of memory cell sections;
  a plurality of write circuits which respectively write data forwarded from said plurality of write data bus lines, said plurality of memory cell blocks;

a plurality of sense amplifiers which respectively amplify the data read out from the memory cell blocks and forward the amplified data to said plurality of read-out data bus lines;

an input circuit which is connected to said plurality of write data bus lines and which, in a normal mode, supplies an input data to a selected memory cell section among said plurality of memory cell sections via one of said plurality of write circuits corresponding to said selected memory cell section;

an output circuit which is connected to said plurality of read-out data bus lines and, in the normal mode, outputs read out data which is read out from a selected memory cell section among said plurality of memory cell sections by one of said plurality of sense amplifiers corresponding to said selected memory cell section;

a test mode setting circuit which, in a test mode, activates all of said plurality of write circuits for performing the data writing of the same data in all of said plurality of memory cell sections simultaneously, and activates said plurality of sense amplifiers for performing the data reading from all of said plurality of memory cell sections simultaneously;

a test mode switching circuit which, in the test mode, logically processes the data supplied from all of said plurality of sense amplifiers activated by said test mode setting circuit and causes said output circuit to output an output signal which indicates information as to a presence or an absence of any defective memory cells;

a plurality of transfer gates having input nodes which are connected to said plurality of sense amplifiers, respectively, and output nodes which are commonly connected together;

an inverter circuit having an output node and an input node which is connected to the output nodes of said plurality of transfer gates;

an output buffer circuit having an input node which is coupled to the output node of said inverter circuit via said test mode switching circuit, and a signal output terminal for outputting said output signal;

said test mode switching circuit comprising:

a first transfer gate circuit for interrupting a data path from the output node of said inverter circuit to the input node of said output buffer circuit in the test mode;

a coincidence circuit for taking a logical exclusive OR and a logical NAND of the data supplied from said plurality of sense amplifiers; and a second transfer gate circuit for transferring an output from said coincidence circuit to the input node of said output buffer circuit.

2. A static random access memory device according to claim 1, in which said first transfer gate circuit has, for forming said data path, a PMOS transistor, an NMOS transistor and an inverter, and said second transfer gate circuit has two transfer gates each of which has a PMOS transistor and an NMOS transistor and an inverter.

* * * * *